United States Patent [19]
Ward

[11] 3,945,943
[45] Mar. 23, 1976

[54] ZEOLITE CONTAINING COMPOSITIONS, CATALYSTS AND METHODS OF MAKING

[75] Inventor: John W. Ward, Yorba Linda, Calif.

[73] Assignee: Union Oil Company of California, Los Angeles, Calif.

[22] Filed: Oct. 15, 1973

[21] Appl. No.: 406,225

Related U.S. Application Data

[63] Continuation-in-part of Ser. No. 191,123, Oct. 20, 1971, abandoned.

[52] U.S. Cl. ............................................. 252/455 Z
[51] Int. Cl.$^2$ .......................................... B01J 29/06
[58] Field of Search ................... 252/455 Z; 423/328

[56] References Cited
UNITED STATES PATENTS

| | | | |
|---|---|---|---|
| 3,257,310 | 6/1966 | Plank et al. | 252/455 Z |
| 3,391,075 | 7/1968 | Plank et al. | 252/455 Z |
| 3,393,147 | 7/1968 | Dwyer et al. | 252/455 Z |
| 3,402,996 | 9/1968 | Maher et al. | 252/455 Z |
| 3,449,070 | 6/1969 | McDaniel et al. | 252/455 Z |

*Primary Examiner*—Carl F. Dees
*Attorney, Agent, or Firm*—Richard C. Hartman; Lannas S. Henderson; Dean Sandford

[57] ABSTRACT

Improved combinations of zeolites and refractory inorganic oxides are formed from mixtures of the ammonium, stabilized hydrogen forms of crystalline zeolitic aluminosilicates and amorphous refractory inorganic oxides upon calcination under substantially dry conditions at temperatures of at least about 600°F sufficient to convert the ammonium ions to hydrogen ions. The resultant compositions have a wide range of uses due to their improved ion exchange capacity, catalytic activity and tolerance to numerous environments.

15 Claims, No Drawings

ZEOLITE CONTAINING COMPOSITIONS, CATALYSTS AND METHODS OF MAKING

BACKGROUND

This application is a continuation-in-part of my copending application Ser. No. 191,123, filed Oct. 20, 1971 now abandoned.

Crystalline aluminosilicates have found application in numerous areas due to their unique properties. The most significant of these qualities are ion exchange capacity, selective adsorbent capacity, and catalytic activity, particularly that involving acid catalyzed reactions such as hydrocarbon conversion by cracking, hydrocracking, hydrogenation, isomerization, denitrogenation, alkylation and the like.

Attempts to improve one zeolite property, e.g., thermal or hydrothermal stability, have resulted in the deterioration of other desirable quality. For example, zeolites employed as selective adsorbents or as components of hydrocarbon conversion catalysts are known to deactivate after extended use. One regeneration method involves heating the zeolite to an elevated temperature sufficient to either drive off adsorbed higher molecular weight materials or either rehydrate or dehydrate the material. Yet the effectiveness of these procedures is limited, at least to some extent, by the relative instability of zeolites to elevated temperatures. The degree of this instability is also a function of the environment in which the zeolite is regenerated.

One of the most significant shortcomings of high temperature regeneration has been decrepitation of the zeolite including loss of crystallinity, surface area, pore volume, acidity, exchange capacity and catalytic activity. This is particularly true with hydrocarbon conversion catalysts due to the extreme temperatures required. Similar effects have been noted as a result of prolonged exposure to chemical environments such as ammonia gas. Gradual loss of zeolite properties has been observed in hydrocarbon conversion systems in which ammonia is evolved upon the conversion of organonitrogen compounds. Rapid deterioration results upon the regeneration of many metal-containing zeolite catalysts in ammonia atmospheres. Ammonia regeneration is often the most expeditious way to effect redistribution of active metals, e.g., platinum and palladium, in zeolite pores.

Although the occurrence of these effects has received a great deal of attention due to the economic significance of hydrocarbon conversion systems, it is apparent that the loss of surface area, pore volume, acidity and ion exchange capacity upon regeneration, exposure to operating conditions, or treatment for any other purpose, is also detrimental in other uses of these materials.

One effort to improve zeolite qualities is discussed by Maher et al in U.S. Pat. No. 3,293,192. The authors discovered that a Y zeolite, such as that disclosed by Rabo et al in U.S. Pat. No. 3,130,007, could be treated in such a way as to dramatically improve thermal stability. In addition to improved tolerance to high temperatures, the resultant product also had a considerably reduced alkali metal content and a reduced cell constant ($a_o$). However, as shown by the examples discussed hereinafter, the improvements in thermal stability were accompanied by reduced ion exchange capacity, acidity, activity and tolerance to certain process and regeneration conditions such as gaseous ammonia atmospheres. These consequences are illustrative of those often encountered in this field. Procedures effective for improving one zeolite quality are either not sufficient to improve other properties to the extent that can be realized by alternative procedures or actually cause a loss of one or more unrelated although desirable characteristics.

It is therefore one object of this invention to provide improved zeolite containing compositions. Another object is the provision of a zeolite-refractory oxide combination having improved thermal and ammonia stability and residual ion exchange capacity. Another object is the provision of improved hydrocarbon conversion catalysts. Still another object is the provision of improved catalysts and method for promoting acid catalyzed hydrocarbon conversions. Another object is the provision of improved hydrogenative hydrocarbon conversion methods and catalysts. Yet another object is the provision of a highly active hydrocracking catalyst and methods of using the same. Another object is a provision of a highly active hydrocracking catalyst with high selectivity to midbarrel fuels. Another object is the provision of an improved zeolite containing isomerization catalyst. Another object is the provision of an improved method for producing zeolite containing compositions. Another object is the provision of a method for producing zeolite containing compositions having high activity and stability.

In accordance with one embodiment a zeolite-refractory oxide combination is prepared by calcining the ammonium, stabilized hydrogen form of a crystalline zeolitic aluminosilicate intimately mixed with an amorphous refractory inorganic oxide at a temperature of at least about 600°F sufficient to decompose the ammonium ion. In accordance with another embodiment the resultant aluminosilicate containing composition is employed to promote acid catalyzed hydrocarbon conversions by contacting a hydrocarbon feed at an elevated temperature sufficient to promote conversion of the feed in the presence of the catalyst. In another embodiment the composition is combined with one or more catalytically active metals or compounds thereof to produce a hydrocarbon conversion catalyst.

In accordance with another embodiment a zeolite-refractory oxide combination is prepared by (a) steaming an alkali metal aluminosilicate having at least 20 percent of its ion exchange capacity occupied by ammonium ions at a temperature of at least about 650°F in the presence of at least 0.5 psi water vapor pressure during at least the initial stage of thermal treatment, (b) re-exchanging the resultant composite with ammonium ion to a degree sufficient to occupy at least 20 percent of the residual ion exchange capacity of the zeolite with ammonium ions and reduce the exchangeable alkali metal content of the zeolite to less than 2 weight percent determined as the corresponding alkali metal oxide, (c) intimately mixing the resultant zeolite containing a steam stabilized hydrogen ion portion and an unstabilized ammonium ion portion with a refractory inorganic oxide, and (d) calcining the resultant combination at a temperature of at least about 600°F.

Although the specific effects and interrelationships of all of these steps cannot be presently explained and are not now known with certainty, it has been established they are essential to the production of zeolite compositions having the superior properties discussed herein. Several of the observations on which these findings are based are described hereinafter. It is shown that calcining the zeolite in the first step under relatively anhydrous conditions results in the destruction of a substantial amount of the zeolite crystalline structure with a consequent loss in surface area, ion exchange capacity, thermal stability and activity. On the other hand, I have unexpectedly found that steaming the zeolite in the second calcination step in the presence of substantial amounts of water vapor as opposed to calcination under relatively anhydrous conditions renders the resultant composition less active for hydrocarbon conversion and less selective to midbarrel fuels. Accordingly, it is presently preferred to effect the thermal treatment in the presence of the refractory oxide in a relatively anhydrous atmosphere. Nevertheless, in its broadest sense, this invention includes compositions which are steamed in this step. I have also discovered that the zeolite compositions prepared by these methods demonstrate considerably higher activity, ion exchange capacity and stability in the presence of ammonia gas than is exhibited by compositions prepared by either steaming or calcining the re-exchanged zeolite before admixture with the refractory oxide.

The zeolites are crystalline aluminosilicates having ion exchange capacities sufficient to enable the incorporation of substantial amounts of ammonium ions by ion exchange. In addition, they must have sufficient structural stability to withstand the described calcination and steaming conditions. A number of natural and synthetic materials are known to meet these requirements.

Preferred zeolites for use herein include the synthetic zeolite and Y and zeolites T, L and SL, synthetic faujasites such as Zeolite Y having $SiO_2/Al_2O_3$ ratios above about 3 being particularly preferred. The ion exchange capacity of both the natural and synthetic zeolites is usually originally occupied by alkali metal ions, particularly sodium and potassium ions.

If the compositions of this invention are to be produced from a naturally occurring aluminosilicate or a synthetic zeolite as produced that material is preferably first exchanged with ammonium ions in an amount sufficient to occupy at least 20 percent of the ion exchange capacity of the zeolite. A corresponding amount, i.e., 20 relative percent of the alkali metal originally present in the zeolite is replaced by ammonium ions. However, it is presently preferred that this first exchange step be sufficient to reduce the alkali metal content of the aluminosilicate to less than 3 percent and preferably less than 2 percent alkali metal. This procedure is usually sufficient to introduce at least about 0.5 milliequivalents of ammonium ions per gram of zeolite.

Illustrative ammonium compounds suitable for either exchange step are the organic and inorganic ammonium salts such as ammonium halides, e.g., chlorides, bromides, ammonium carbonates, ammonium thiocynate, ammonium hydroxide, ammonium molybdate, ammonium dithionate, ammonium nitrate, ammonium sulfate, ammonium formate, ammonium lactate, ammonium tarteate and the like. Other suitable exchange compounds include hydrocarbon and organic amines such as the class of organic nitrogen bases including pyridine, guanidine, and quinoline salts. Another class of organic compounds includes the complex polyhydrocarbyl ammonium slats, e.g., the tetraalkyl and tetraaryl salts such as tetramethylammonium hydroxide and tetraethylammonium hydroxide. However, it is presently preferred that the ammonium ion be introduced by ion exchange with an inorganic ammonium salt such as ammonium nitrate or ammonium sulfate.

It is essential that the zeolite be steamed following the first exchange, as opposed to calcination under anhydrous conditions. Accordingly, this thermal treatment is usually conducted in the presence of at least about 0.2, usually at least about 0.5 psi water vapor pressure, and preferably about 2 to about 15 psi water vapor partial pressure. This objective can be realized by any procedures capable of maintaining a substantial amount of water vapor in the presence of the zeolite during at least the initial stages of the thermal treatment. For example, the exchanged zeolite can be introduced into a batch or continuous rotary furnace, a moving bed furnace or static bed calcination zone into which humidified air, or more preferably saturated air, is introduced either cocurrently or countercurrently. In the alternative, provision can be made to trap sufficient water vapor released during the initial stage of calcination to meet these conditions.

Steaming temperatures should be sufficient to thermally stabilize and convert the zeolite to the corresponding hydrogen or decationized form. These temperatures exceed 600°F, are usually about 800° to about 1650°F, preferably between 1025° and 1650°F and most preferably about 1100° to about 1400°F. The zeolite is subjected to these temperatures for a period sufficient to convert the zeolite to the desired stabilized hydrogen or decationized form. The duration of this treatment is usually at least about 0.5 minutes, preferably about 10 minutes to about 4 hours at temperature. When the preferred faujasites are employed steaming temperature, duration and water partial pressure should be correlated to reduce the unit cell constant ($a_o$) to a value between about 24.40 and about 24.64, preferably between 24.42 and 24.62A.

If desired, the resultant zeolite can be subject to further ion exchange and steaming to increase the hydrogen ion content and correspondingly reduce alkali metal content. However, I have found that the necessary degree of exchange can be efficiently accomplished by one exchange-steaming cycle.

The resultant steamed zeolite is then re-exchanged with ammonium ion under conditions sufficient to reduce the alkali metal content to less than 2 percent, usually less than 1 percent and preferably less than 0.6 weight percent determined as the corresponding alkali metal oxide. These conditions are usually sufficient to produce a zeolite containing an amount of ammonium ion corresponding to at least about 5 relative percent of the original ion exchange capacity, which means that the initial ion-exchange treatment should not have been so severe as to remove more than about 95% of the original alkali metal content. The zeolite having this composition is then mixed with a refractory inorganic oxide prior to further thermal treatment. The refractory oxide can be selected from alumina, silica, magnesia, beryllia, zirconia, titania, thoria, chromia, combinations thereof such as silica-alumina, silica-magnesia, silica-alumina-beryllia, naturally occurring clays containing such refractory oxides or combinations thereof and the like. Silica-magnesia, alumina, and combinations of alumina with other oxides are presently preferred. The naturally occurring clays should be acid extracted prior to mixing with the zeolite. Such acid extraction is generally well known and is used to remove soluble constituents, generally heavy metal oxides.

The mixture of refractory oxide and zeolite usually contains at least about 0.5, generally at least about 2, and preferably about 2 to about 90 weight percent zeolite based on the combined dry weight of zeolite and refractory oxide. The refractory oxide can be combined with the aluminosilicate either as a hydrous sol or gel or as a anhydrous or thermally activated gel. In addition, a hydrous sol or solution of the refractory oxide precursor such as an alkali metal silicate or aluminate can be precipitated to form a gel in the presence of the aluminosilicate.

The resultant combination is then subject to a second thermal treatment. However, the zeolite-refractory oxide combination can be further modified at this point when it is desired to produce an ultimate composition containing either stabilizing or catalytically active metals, metal ions or oxides. The metal, metal ion or compound can be incorporated into the zeolite either before or after addition of the refractory oxide. These metals, compounds and ions include those listed in periodic Groups IB, II, IV, V, VI, VII and VIII in addition to the actinide and lanthanide series. The Group VI and VIII metals are presently preferred. Particularly active catalysts contain Group VI metals or compounds thereof, particularly compounds of molybdenum and tungsten, the iron group metals, particularly nickel and cobalt, or noble metals such as platinum and palladium. The metals, compounds or ions can be added to the zeolite, the refractory oxide or the combination of both components.

Numerous methods of combining metals, metal compounds or metal ions with zeolites and/or refractory oxides are well known and need not be detailed. Exemplary procedures include ion exchange, comulling, coprecipitation, and the like.

Metal concentrations will vary considerably as indicated in other publications depending upon the metal or metal compound employed and the properties desired. For example, concentrations of the noble metals are usually relatively low. Metal or metal ion concentrations of less than about 2 percent based on the combined weight of the zeolite and refractory oxide are usually the rule. On the other hand, the iron group metals, notably nickel and cobalt, are usually incorporated in larger amounts of up to about 15 percent, usually about 0.5 to about 10 percent determined as the corresponding oxide. Even higher concentrations of the Group VI metals, e.g., molybdenum and tungsten, can be employed equivalent to about 2 to about 40 weight percent of the corresponding metal oxide.

The combination of zeolite and refractory oxide either with or without added metal components is then subjected to a calcination step. This procedure is effected by subjecting the composition to a temperature of at least about 600°F up to about 1500°F, preferably about 700° to about 1000°F. Maintenance of a relatively anhydrous environment during this thermal activation is presently preferred. The presence of substantial water vapor appears to result in less active products. Accordingly, this thermal treatment is preferably conducted in the presence of less than about 2, and preferably less than about 1 psi water vapor partial pressure.

The product can either be employed directly as a catalyst, ion exchange agent, etc. In the alternative, the calcined combination can be further modified by the incorporation of catalytically active components such as those previously discussed. Thus, stabilizing or catalytic components can be added before or after the last mentioned calcination step. The amounts of materials thus added after calcination and the manner in which they are incorporated with the calcined material include all of those previously mentioned which are compatible with the physical form of the product such as impregnation, ion exchange, comulling, and the like.

However, one characteristic of these compositions makes them more compatible with certain impregnation or exchange procedures. This matter involves the markedly improved stability of these compositions to basic environments such as ammoniacal solutions or ammonia atmospheres, particularly when the resultant composition is to be subsequently exposed to elevated temperatures. As a result of this quality it is possible to contact the zeoliterefractory oxide combination with either ammoniacal solutions of active components or active component precursors or ammonia atmospheres as might exist during impregnation, ion exchange or regeneration.

For example, previous investigators have observed that a greater degree of palladium or platinum dispersion in aluminosilicate containing catalysts can be achieved by contacting zeolites with an aqueous solution of an ammonium complex such as tetraaminepalladium chloride or the like. Similarly, it has also been observed that active metals such as platinum or palladium can be regenerated after use by contacting with ammonia at ambient or elevated temperatures. Such procedures are known to result in considerable loss of zeolite structural integrity, exchange capacity and catalytic activity in zeolites that are not stable to ammonia or ammonium hydroxide solutions. The illustrative examples discussed hereinafter demonstrate these effects and the high reammoniation stability of the compositions of this invention.

These compositions presently demonstrate the greatest advantage in the area of hydrocarbon conversion. A wide range of organic, particularly hydrocarbon, reactions are promoted by acid catalyzed or carbonium ion mechanisms both in the presence and absence of hydrogen. The most significant of these include dealkylation, isomerization, catalytic cracking, hydrogenation, alkylation, dehydrogenation, dehydrocyclization, reforming, desulfurization, denitrogenation and hydrocracking. A number of these can be classified as hydrogenative hydrocarbon conversions, e.g., hydrocracking, denitrogenation, hydrogenation, and other forms of hydrocarbon conversion which are promoted in the presence of significant hydrogen partial pressure.

The term hydrogenative hydrocarbon conversion is intended to include all reactions such as those mentioned above in which hydrogen is reacted with conventional hydrocarbon feedstocks including all forms of hydrocarbons such as aliphatic, cycloaliphatic, olefinic, aromatic - including alkaryl and aralkyl aromatic compounds - in addition to organonitrogen and organosulfur compounds, particularly those found in conventional hydrocarbon feeds. Exemplary of the most common hydrocarbon feeds are the light and heavy naphthas and gas oils, vacuum gas oils, coker distillates, residua, cat-cracked distillates and cycle stocks and the like.

The mechanisms involved in these systems include the reaction of hydrogen with carbon-to-carbon single bonds, carbon-to-carbon double bonds, aromatic rings, nitrogen-to-carbon and sulfur-to-carbon bonds or, in some cases, the reaction of hydrogen with either or both substituents adjacent the bond either during or after bond cleavage. As demonstrated by the examples hereinafter detailed, the systems of this invention exhibit superior characteristics in the conduct of such hydrogenative conversions.

These hydrogenative conversion systems are generally characterized by the presence of substantial amounts of added hydrogen, superatmospheric hydrogen partial pressures and net hydrogen consumption. This class of reactions also includes hydrocracking in which sufficient carbon-to-carbon bond cracking and hydrogenation is effected to reduce a substantial proportion of the feed to lower boiling products.

Feedstocks having utility in this broad class of hydrogenative conversions boil above 100°F, generally above about 200°F and usually within the range of about 400° to about 1300°F. Of course, hydrocracking and catalytic cracking feedstocks usually comprise only higher boiling materials, e.g., those boiling between about 400° and about 1300°F, preferably between about 700° and about 1300°F.

Reaction conditions vary substantially depending upon the desired reaction and the severity required to obtain the preferred result. Conditions necessary to effect the several processes mentioned are well known. Hydrogenative conversion conditions include reaction temperatures of at least about 400°F usually at least about 600°F and preferably about 650° to 850°F, pressures of at least 200 psig, usually 500 to 5000 psig, and hydrogen addition rates of at least 50, generally at least about 100, and preferably about 400 to about 20,000 standard cubic feet per barrel. Reaction times should be at least about 1 minute, preferably at least about 5 minutes, and usually correspond to liquid hourly space velocities (LHSV) in fixed bed catalyst systems in excess of about 0.1, generally about 0.4 to about 15.

The ranges within which hydrocracking, denitrogenation and desulfurization can be obtained overlap considerably and depend in large part on the reaction severity required to convert a significant part of the feed, the inhibiting effect of feed components such as organonitrogen compounds on cracking or hydrofining activity and the specific catalyst composition. However, the conditions required to obtain the desired result, e.g., denitrogenation, hydrocracking, etc., with a specific catalyst, can be readily ascertained by testing the feed and catalyst at several sets of operating conditions and correlating the conversion results thus obtained.

Hydrocracking conditions should be sufficiently severe to convert at least 20 and preferably at least 40 volume percent of the feed to products boiling below the initial feed boiling point. This generally corresponds to hydrogen consumptions of at least about 250 standard cubic feet per barrel of feed and the production of at least about 110 mols, preferably at least about 120 mols of product for each 100 mols of feed.

Hydrocracking feeds need not, and preferably do not, contain substantial amounts of organonitrogen or organosulfur compounds. Obviously, hydrofining feeds do contain significant amounts of one or both of these components, and usually contain up to about 5 weight percent sulfur as organosulfur compounds and as much as 3 weight percent nitrogen as organonitrogen compounds. Similarly, the feed to hydrogenation zones should contain substantial amounts of unsaturated compounds which, incidentally, can have considerably lower boiling points than the feeds conventionally employed for hydrocracking, denitrogenation and other hydrogenative conversions. Illustrative unsaturated hydrocarbons include olefins, such as ethylenes, butenes, cyclohexenes, aromatics and the like. In fact, these methods and catalysts are particularly useful for hydrocracking and hydrogenating aromatic feeds containing as little as 5 and usually between about 10 and about 80 volume percent aromatics. Reaction conditions for hydrogenation should be correlated so as to increase the hydrogen/carbon ratio of the unsaturated components by a factor of at least about 5 percent on a molar basis. In other words, the ratio of hydrogen to carbon in the unsaturated feed fraction should be increased by at least about 5 percent, preferably at least about 10 percent, although much higher conversion is often desirable.

Conditions involved in other conversions such as catalytic cracking, isomerization, and the like differ somewhat from those described above. For example, catalytic cracking conditions usually include temperatures between about 700° and about 1200°F, total system pressures ranging from subatmospheric to about 550 psig, and little or no added hydrogen. However, the use of minor amounts of hydrogen, e.g., 5 to about 100 psi hydrogen partial pressure, are useful for reducing catalyst deactivation rates.

Isomerization usually involves the conversion of hydrocarbons having 4 or more carbon atoms, usually about 4 to about 20 carbon atoms. Reaction conditions include temperatures between about 400° and about 1000°F, preferably about 500° to about 900°F. Dehydrogenation of paraffinic or alkyl aromatic hydrocarbons can be carried out at temperatures similar to those described for catalytic cracking in the absence of added hydrogen. Similar conditions can be used to effect dehydrocyclization of hydrocarbons which can be dehydrogenated and isomerized into cyclic products. These feeds usually comprise paraffinic hydrocarbons, preferably normal paraffins, having at least about 6 carbon atoms per molecule such as normal hexane, normal heptane, normal octane and the like which are converted primarily to benzene, toluene and xylenes.

Preferred isomerization and dehydrocyclization catalyst comprise zeolites containing Group IIa or IIB metals such as magnesium, calcium, strontium, zinc and the like. Manganese, iron, cobalt and nickel zeolites may also be employed, however.

Reforming is usually carried out at temperatures between about 800° and about 1000°F, hydrogen partial pressures between about 100 and about 400 psig and contact times corresponding to liquid hourly space velocities in fixed bed systems of about 0.5 to about 5. Catalytic dealkylation conditions usually include temperatures of 800 to about 1100°F, moderate hydrogen pressures between 300 and 1000 psig and space velocities of about 0.5 to about 5.

EXAMPLE 1

A comparison composition was prepared by exchanging 1000 grams of sodium Y-zeolite containing 50 percent non-volatile matter with a solution of 500 grams of ammonium sulfate in 2000 milliliters of water at 200°F for 1 hours. The exchange was repeated with a fresh solution for 2 hours after which the zeolite was steamed at 1472°F (800°C) for 1 hour by heating in a covered container in a preheated furnace. The zeolite was then re-exchanged twice with ammonium sulfate as desribed above, dried at 230°F (110°C) and calcined at 1472°F for 1 hour. The product, having a sodium content of 0.3 weight percent, was mixed with sufficient alumina and water to produce an extrudable paste containing 20 weight percent zeolite and 80 weight-percent alumina on a dry weight basis. This mixture was extruded. The extrudates were calcined at 900°F for 2 hours. Nickel and tungsten were added by impregnation with a solution containing nickel nitrate and Eighty percent (80%) conversion to products boiling below 685°F was obtained at a temperature of 735°F.

EXAMPLE 5

The operation of Example 4 was repeated employing the catalyst described in Example 1. Under these conditions a conversion of 66.5 percent per pass to products boiling below 685°F was obtained at 735°F.

| Ex. No. | Catalyst | Pressure | Temperature | Conversion/Selectivity | |
|---|---|---|---|---|---|
| 1 | Comparison | 2000 | 731 | 65 | 54.9 |
| 2 | Inv. | 2000 | 722 | 65 | 66.8 |
| 3 | Inv. | 2000 | 730 | 83 | n.a. |
| 4 | Inv. | 1800 | 735 | 80 | n.a. |
| 5 | Comparison | 1800 | 735 | 66.5 | n.a. | ammonium metatungstate in amounts sufficient to introduce 3.9 weight percent NiO and 22.3 weight percent $WO_3$. The pellets were then calcined at 900°F for 1 hour.

After sulfiding, the extrudates were employed to hydrocrack a gas-oil containing 0.082 percent nitrogen as organonitrogen compounds and 2.91 percent sulfur as organosulfur compounds boiling between 580° and 990°F in a single-pass fixed bed reactor. Operating conditions included a pressure 2000 psig, 1.5 LHSV and a hydrogen addition rate of 10,000 scf/bbl of feed. A temperature of 731°F was required to obtain 65 percent conversion to products boiling below 685°F at a turbine fuel selectivity of 54.9 percent. Turbine fuel selectivity is the volume percentage of products boiling below 570°F that boil above 300°F. A temperature increase of 23°F was required to double conversion rate.

EXAMPLE 2

The sodium zeolite Y described in Example 1 was ammonium exchanged, steamed and re-exchanged as described in Example 1. The second calcination at 1472°F was omitted. The ammonium-steamed stabilized hydrogen zeolite was then mixed with sufficient alumina and water to form an extrudable paste containing 20 weight percent zeolite and 80 percent alumina on a dry weight basis. The paste was extruded and calcined, combined with ammonium metatungstate and nickel nitrate and recalcined as described in Example 1.

The product was sulfided to convert the feed described in Example 1 under identical conditions. A reaction temperature of 722°F was required to obtain 65 percent conversion to products boiling below 685°F with a turbine fuel selectivity of 66.8 percent. A temperature increase of 10°F was required to double conversion rate.

EXAMPLE 3

The operation of Example 2 was repeated at a temperature of 730°F at which 83 percent conversion to products boiling below 685°F was obtained.

EXAMPLE 4

The operation of Example 1 was repeated using a catalyst prepared as in Example 2. The product contained 4.1 percent NiO as 22.8 percent $WO_3$. This composition was used to convert the feed described in Example 1 under identical conditions with the exception that reactor pressure was reduced to 1800 psig.

These results demonstrate that the compositions of this invention (Examples 2 through 4) are both more active and more selective than the comparison (Examples 1 and 5). At the same conversion level (65% per pass) the inventive composition (Example 2) had a selectivity of 66.8 as opposed to 54.9 for the comparison (Example 1). At a temperature of 731°F the comparison (Example 1) produced a conversion of 65 percent per pass while the inventive composition (Example 3), at a slightly lower temperature (730°F), produced a conversion of 83% per pass. This difference in activity is confirmed by comparison of Examples 4 and 5 (1800 psig) wherein the inventive composition (Example 4) produced 80% conversion as opposed to only 66.5% for the comparison (Example 5).

The superiority of the preferred compositions over otherwise identical catalysts containing rare earth exchanged zeolites is demonstrated by the following examples.

EXAMPLE 6

A composition of this invention was produced by exchanging, steaming and re-exchanging an alkali metal Y zeolite as described in Example 2. The steamed, re-exchanged zeolite was exchanged with sufficient tetraamine palladium chloride to introduce 0.5 weight percent palladium in the final catalyst including zeolite and alumina. The zeolite was then mixed with sufficient alumina to produce a composition containing 80 weight percent zeolite and 20 weight percent alumina on a dry weight basis. This material was then extruded, dried and calcined at 900°F. The product was then reduced in flowing hydrogen and used to hydrocrack a hydrofined gas-oil boiling between 340° and 800°F having an API gravity of 35.8° and containing 0.5 weight percent sulfur and 0.2 weight percent nitrogen added as thiophene and tertiary butylamine respectively. Reaction conditions included a pressure of 1450 psig, hydrogen addition rate of 8000 standard cubic feet per barrel of feed and a space velocity of 1.7 LHSV. A reaction temperature of 691°F was required to maintain conversion to a 47° API gravity product.

EXAMPLE 7

This composition was identical to that described in Example 6 with the exception that the steamed, re-exchanged zeolite was exchanged with sufficient rare-earth chlorides, primarily lanthanum and cerium chlorides, to introduce 0.5 weight percent rare earth metals into the zeolite determined as the corresponding oxides prior to exchanging, as described, with the tetraamine palladium chloride. The zeolite was then mixed with alumina, extruded, calcined and reduced as described in Example 6.

The resulting catalyst was used to convert the feed described in Example 6 under identical conditions. A temperature 6 degrees higher, 697°F, was required to maintain conversion to a 47° API gravity product.

| Ex. No. | Composition | Temperature for 47° API Product, °F |
|---|---|---|
| 6 | Invention, 0.5 Pd | 691 |
| 7 | Comparison, 0.5 Pd + 0.5 R.E. | 697 |

EXAMPLE 8

A composition containing 0.5 weight percent palladium was prepared by the method described in Example 6. This catalyst was used to convert the hydrofined gas-oil described in Example 6 containing 0.5 weight percent added sulfur as thiophene. Nitrogen was not added in this operation. Reaction conditions were identical to those described in the Examples 6 and 7. A temperature of 518°F was required to maintain conversion to a 49.5° API gravity product.

EXAMPLE 9

The operation of Example 8 was repeated under identical conditions and with an identical catalyst with the exception that the steamed, re-exchanged zeolite was exchanged with a mixture of rare earth chlorides under conditions sufficient to introduce 6.33 weight percent rare earths determined as the oxides. This composition was then exchanged with palladium, combined with alumina, extruded, calcined and reduced as described in the previous examples.

The finished product was employed to convert the feed described in Example 8 under identical conditions. A temperature of 558°F was required to maintain conversion to the 49.5° API product.

EXAMPLE 10

A composition similar to that described in Example 9 was prepared by exchanging the steamed, re-exchanged zeolite with cerium oxide prior to addition of palladium under conditions sufficient to introduce 0.68 weight percent cerium determined as $CeO_2$. The catalyst was finished as described in Example 8 and was then used to convert the same feed under identical conditions. A temperature of 544°F was required to maintain conversion to the 49.5° API product. The results of Examples 8 through 10 are summarized in the following table.

| Ex.No. | Composition | Temperature for 49.5° API Product, °F |
|---|---|---|
| 8 | Invention, 0.5 Pd | 518 |
| 9 | Comparison, 0.5 Pd + 6.33 RE | 558 |
| 10 | Comparison, 0.5 Pd + 0.68 $CeO_2$ | 544 |

These results demonstrate that the addition of significant amounts of rare earths by ion exchange to otherwise identical compositions of this invention significantly reduces the activity of those compositions. Temperature increases of 40°F and 26°F were required to maintain the same conversion in Examples 9 and 10, respectively. The only difference between these compositions and the catalyst of Example 8 was the presence of rare earth ions.

The superiority of these compositions for isomerization is illustrated by Examples 11 through 13.

EXAMPLE 11

A sodium Y zeolite, as prepared, was exchanged with an ammonium sulfate solution until the sodium content was reduced to approximately 2 weight percent determined as $Na_2O$. This material was then steamed in 100 percent steam at 1292°F and re-exchanged with ammonium sulfate to reduce the sodium level to approximately 0.2 weight percent determined as $Na_2O$, and introduce a corresponding amount of ammonium ion.

A portion of this zeolite was combined with sufficient alumina to provide a combination containing 50 weight percent alumina and 50 weight percent zeolite on a dry weight basis. The combination was extruded and calcined in flowing dry air at 900°F. The xylene isomerization rate coefficients of the zeolitealumina combination was determined by passing xylene over a fixed bed of the calcined extrudates at atmospheric pressure and 500°F. This material had a xylene isomerization rate coefficient of 65.

EXAMPLE 12

A comparison composition was prepared by treating a second portion of the zeolite described in Example 11 after the second exchange as follows. Prior to combination with alumina the zeolite was calcined in flowing dry air at 900°F and as then combined with sufficient alumina to produce a composition containing 50 weight percent alumina and 50 weight percent zeolite on a dry weight basis. This combination was formed into extrudates and calcined in air at 900°F. The finished material had a xylene isomerization rate coefficient of 35 determined as in Example 11.

EXAMPLE 13

A second comparison was prepared from the re-exchanged zeolite described in Example 11 as follows. Prior to combination with alumina, the zeolite was calcined at 1472°F and was then mixed with sufficient alumina to produce a combination containing 50 weight percent alumina on a dry weight basis. This material was extruded and calcined as described in Examples 11 and 12. The calcined extrudates had an isomerization rate coefficient of 30 determined as described in Example 11, less than half that exhibited by the composition of Example 11.

The results of Examples 11 through 13 are summarized in the following table.

| Ex. No. | Composition | Xylene Isomerization Rate Coefficient |
|---|---|---|
| 11 | Invention: zeolite mixed with 50% alumina then calcined at 900°F | 65 |
| 12 | Comparison: zeolite calcined at 900°F, combined with 50% alumina and calcined at 900°F | 35 |
| 13 | Comparison: zeolite calcined at 1472°F, combined with alumina and calcined at 900°F | 30 |

These results illustrate that the invention composition (Example 11) was approximately twice as active as comparisons (Examples 12 and 13). Isomerization activity is known to reflect acidity and cracking activity. Thus, it is also apparent from these results that the inventive composition possessed substantially higher acidity and cracking activity than did the two comparisons.

The superior reammoniation stability of these compositions is illustrated by the following five preparations.

EXAMPLE 14

A composition of this invention was prepared as described in Example 2 by exchanging a sodium Y zeolite having an $SiO_2/Al_2O_3$ ratio of 4.8 to a sodium level of 1.7 weight percent $Na_2O$ with ammonium sulfate. The product was steamed at 1292°F for 1 hour and re-exchanged with ammonium sulfate to a $Na_2O$ level of 0.2 weight percent. This material was then exchanged with tetraamine palladium chloride to introduce 0.65 weight percent palladium. An extrudable paste of alumina and zeolite was formed containing 80 weight percent zeolite on a dry weight basis. The paste was extruded and calcined at 930°F in the presence of flowing ambient air having a water vapor pressure of less than 0.5 psi.

The ammonia stability of this composition was determined by rehydrating the calcined product in saturated air at 70°F for 16 hours. 100 percent ammonia gas was then passed upwardly through the zeolite contained in a packed column for 2 ½ hours. Excess ammonia was removed by nitrogen purging and the material was calcined in flowing dry air at 900°F for 1 hour. Surface area and crystallinity were determined by nitrogen sorption and X-ray diffraction before and after ammonia treatment.

EXAMPLE 15

A zeolite characterized as "ultra-stable" zeolite in U.S. Pat. No. 3,293,192 was prepared in accordance with procedure A discussed by McDaniel and Maher in their publication "New Ultra-Stable Form of Faujasite," Society of Chemical Industry, London, 1968, read at the conference held at the School of Pharmacy (University of London) Apr. 4–6, 1967. A sodium Y zeolite is first exchanged with an aqueous solution of ammonium sulfate at 212°F for 15 minutes. The solids are recovered by filtration and exchanged one additional time to reduce the sodium content to about 3 weight percent $Na_2O$. This material is then water washed and calcined at 1004°F for 3 hours. The calcined zeolite is then exchanged twice with ammonium sulfate solution as described above for periods of 1 and 2 hours, respectively. The exchanged zeolite is recovered by filtration and calcined at 1562°F for 3 hours. Ammonia stability was determined as described in Example 14.

EXAMPLE 16

Another composition of this invention containing 0.5 weight percent palladium was prepared and tested for ammonia stability as described in Example 14.

EXAMPLE 17

A portion of the zeolite of Example 15 was exchanged with tetraamine palladium chloride to incorporate 0.65 weight percent palladium. This material was combined with alumina, extruded and calcined at 920°F for 1 hour. The extrudates, containing 80 weight percent zeolite, was tested for reammoniation stability as described in Example 14.

EXAMPLE 18

A commercial sample of the "ultra stable" zeolite precursor described in U.S. Pat. No. 3,449,070 obtained from Davison Chemical Division of W. R. Grace, Inc., was evaluated by the reammoniation stability test described in Example 14. The original zeolite had a crystallinity of 76 percent (compared to a laboratory standard), a unit cell constant of 24.592 and a sodium content of 3.65 weight percent $Na_2O$. This material was first rehydrated in saturated air at 70°F for 16 hours and then calcined at 900°F for 1 hour. Calcination resulted in no loss in crystallinity. The calcined material was then subjected to the reammoniation test described in Example 14. Essentially complete collapse of crystalline structure resulted as illustrated in the following table.

| Ex. No. | Zeolite | Original Cryst. | Original M²/g | Final Cryst. | Final M²/g | Relative Cryst. Loss |
|---|---|---|---|---|---|---|
| 14 | A | 61 | 715 | 57 | 696 | 6.6 |
| 15 | B | 85 | n.a. | 25 | n.a. | 71 |
| 16 | A | 55 | 683 | 45 | 663 | 18 |
| 17 | B | 46 | n.a. | 12 | n.a. | 74 |
| 18 | B | 76 | 733 | 8 | 298 | 90 |

A - Invention
B - Comparison

The two compositions of this invention, Examples 14 and 16, lost only 6.6 and 18 percent of their original crystallinity, respectively. In contrast, the comparison compositions of Examples 15, 17 and 18 lost 71, 74 and 90 percent of their crystallinity, respectively, after ammoniation and recalcination. Thus, the compositions of this invention are far more stable to reammoniation and recalcination.

These compositions also retain a higher degree of residual ion exchange capacity as illustrated by the following examples.

EXAMPLE 19

A composition of this invention was prepared by exchanging a sodium Y zeolite to a sodium content of 2.7 weight percent sodium metal with ammonium sulfate, steamed for 1 hour at 1472°F and re-exchanged with ammonium sulfate to a sodium level of 0.25 percent. The zeolite was then combined with alumina and water, extruded and calcined at 900°F for 1 hour in flowing dry air. The product, a 50/50 mixture of zeolite and alumina, had a residual sodium ion exchange capacity of 0.79 weight percent.

Residual exchange capacity was determined by sequentially exchanging the zeolite-alumina combination three times with excess 10 percent sodium nitrate solution for 2 hours and determining the amount of sodium exchanged into the zeolite.

EXAMPLE 20

A comparison composition was prepared by treating the hydrogen-ammonium zeolite prepared as described in Example 19 taken prior to combination with the alumina, in the following manner. The re-exchanged zeolite was calcined at 1472°F for 1 hour. This material contained 0.25 weight percent sodium. The zeolite was then combined with sufficient alumina to produce a composition containing 50 weight percent alumina on a dry weight basis, extruded and calcined at 900°F for 1 hour in flowing dry air as described in Example 19. The finished extrudate had a residual exchange capacity of 0.25 weight percent determined as described in Example 19.

| Ex. No. | Composition | Exchange Capacity Wt.% Na |
|---|---|---|
| 19 | Invention | 0.79 |
| 20 | Comparison | 0.25 |

EXAMPLE 21

This example demonstrates the hydrogenation activity of the compositions of this invention. The catalyst was prepared as described in Example 6 with the exception that hexamine platinum chloride and the extruded combination of zeolite, platinum and alumina containing 80 weight percent zeolite and 20 weight percent alumina on a dry weight basis was calcined in flowing dry air at 1200°F. The finished composition contained 0.39 weight percent platinum.

Following reduction with hydrogen this material was employed to hydrogenate a light hydrocrackate boiling between 120° and 185°F containing 4 volume percent benzene in a fixed bed reactor. Reaction conditions included a space velocity of 8 LHSV, 280 psig total pressure and 2600 SCF added hydrogen per barrel of feed. A product containing 99 ppm benzene was obtained at a reduction temperature of 360°F. Increasing the reaction temperature 60° to 420°F produced a product containing only 6 ppm benzene.

EXAMPLE 22

This example demonstrates the hydrofining — desulfurization and denitrogenation — activity of these compositions. A nickel-tungsten composition illustrative of this invention was prepared as described in Example 2. The catalyst support contained 5% zeolite and 95% alumina. The finished composition contained 4.2 weight percent nickel determined as NiO and 20.5 weight percent tungsten determined as $WO_3$.

This catalyst was used in a fixed bed reactor to hydrotreat a naphtha boiling between 285° and 450°F having an API gravity of 36.4° and containing 6015 ppm sulfur and 396 ppm total nitrogen. Reaction conditions included a pressure of 200 psig, a hydrogen addition range of 1500 SCF per barrel of feed, and a space velocity of 6.0 LHSV. At a reaction temperature of 600°F residual sulfur had been reduced to 55 ppm and basic nitrogen had been reduced to 251 ppm. At 650°F the hydrotreated product contained only 167 ppm basic nitrogen.

EXAMPLE 23

This example illustrates the preparation and use of catalysts containing a zeolite, silica-magnesia and alumina. The zeolite was prepared as described in Example 2 and combined with amounts of silica, magnesia and alumina sufficient to produce a composition containing 5 weight percent zeolite, 15 weight percent alumina and 80 percent silica-magnesia on a dry weight basis. This material was extruded and calcined at 900°F for 2 hours. The extrudates were then impregnated with nickel nitrate hexahydrate and ammonium tungstate as described in Example 1 in amounts sufficient to incorporate 5.7 weight percent nickel determined as NiO and 18.1 weight percent tungsten determined as $WO_3$. The impregnated extrudates were then calcined for 1 hour at 900°F.

This composition was then employed in a fixed bed downflow reactor to hydrocrack the gas-oil described in Example 1 at the same pressure, space velocity and hydrogen addition rate. A reaction temperature of 728°F was sufficient to obtain 65 percent conversion to products boiling below 685°F with a turbine fuel selectivity of 71.2 percent. A temperature increase of 22°F was required to double the rate of conversion to products boiling below 570°F.

EXAMPLE 24

A catalyst support containing 5 weight percent zeolite, 85 weight percent silica-magnesia and 10 weight percent alumina was prepared as described in Example 22. After calcination the extrudates were impregnated with an aqueous solution of ammonium heptamolybdate, nickel nitrate hexahydrate and orthophosphoric acid at a pH of about 1.1 under conditions sufficient to produce a composition containing 4 weight percent NiO and 16 weight percent $WO_3$. This material was then calcined at 900°F for 1 hour.

After sulfiding this catalyst was used to hydrocrack the feed described in Example 1 under these same conditions. A reaction temperature of 742°F was required to obtain 65 percent conversion to products boiling below 685°F with a turbine fuel selectivity of 72.2 percent. A temperature increase of 21°F was required to double the rate of conversion to products boiling below 570°F.

EXAMPLE 25

This example illustrates the preparation and use of compositions containing silica-alumina cogels. A catalyst having a support containing 20 weight percent zeolite and 80 weight percent of a silica-alumina cogel containing 26 weight percent silica on a dry weight basis was prepared as described in Example 2. The extrudates were impregnated with nickel nitrate hexahydrate and ammonium tungstate as described in Example 1. The finished composition containing 4.6 weight percent NiO and 26.4 weight percent $WO_3$ was finally calcined at 900°F for 1 hour.

After sulfiding the catalyst was employed to hydrocrack the gas-oil described in Example 1 under identical conditions with the exception that reactor pressure was reduced to 1800 psig. A reaction temperature of 756°F was required to obtain 65 percent conversion to products boiling below 685°F with a turbine fuel selectivity of 47.9 percent.

Numerous variations and modifications of the concept of this invention will be apparent in view of the aforegoing disclosure and the appended claims.

I claim:

1. A hydrocarbon conversion catalyst comprising a particle-form aggregate of about 2–90% by weight of a stabilized, rare earth metal-free crystalline aluminosilicate zeolite component and about 10–98% by weight of an amorphous refractory inorganic oxide component selected from the class consisting of alumina, silica, magnesia, beryllia, zirconia, titania, thoria, chromia, and combinations thereof, said catalyst having been prepared by:
   a. ion exchanging a crystalline alkali metal aluminosilicate zeolite having a $SiO_2/Al_2O_3$ ratio above 3 with ammonium ions under exchange conditions adjusted to reduce the alkali metal content of said zeolite to less than about 3 weight percent determined as the metal and replace between about 20% and 95% of the original alkali metal content of said zeolite with ammonium ions;
   b. steaming the resultant exchanged zeolite at a temperature of about 800° to about 1650°F in the presence of at least about 0.5 psi water vapor partial pressure for at least about 10 minutes, sufficient to convert said exchanged zeolite to the corresponding hydrogen form and stabilize said zeolite, said steaming being carried our prior to any calcination of said exchanged zeolite under anhydrous conditions and prior to the addition of said amorphous refractory inorganic oxide component;
   c. re-exchanging the resultant stabilized zeolite with ammonium ions under conditions sufficient to further reduce said alkali metal content to less than about 2 weight percent determined as the corresponding oxide and to introduce into said zeolite an amount of ammonium ions corresponding to at least about 5 percent of the original ion exchange capacity of said zeolite; and
   d. forming the re-exchanged zeolite into a particle-form aggregate containing said refractory oxide intimately admixed therein, and calcining said aggregate at a temperature of at least about 600°F.

2. The catalyst of claim 1 wherein step (d) is carried out under substantially dry conditions.

3. The catalyst of claim 1 wherein said amorphous refractory inorganic oxide component is essentially silicamagnesia.

4. The catalyst of claim 1 wherein said amorphous refractory inorganic oxide component is essentially alumina.

5. The catalyst of claim 1 wherein said zeolite is zeolite Y, said steaming of step (b) is conducted in the presence of about 2 to about 15 psi water vapor pressure for about 10 minutes to 4 hours, said reexchanging of step (c) is conducted under conditions sufficient to reduce said alkali metal content to less than about 1 percent determined as the corresponding alkali metal oxide, and said amorphous refractory inorganic oxide component is essentially alumina.

6. The catalyst of claim 5 including in intimate admixture therewith a catalytic amount of a hydrogenation active component selected from molybdenum, tungsten, nickel, cobalt and the Periodic Group VIII noble metals and compounds thereof, and the resultant combination is formed into a particle-form aggregate and calcined at a temperature between about 600° and about 900°F.

7. The catalyst of claim 6 wherein said hydrogenation component is palladium.

8. The catalyst of claim 6 wherein said hydrogenation component comprises nickel and molybdenum.

9. The catalyst of claim 1 wherein said zeolite is zeolite Y, said steaming of step (b) is conducted in the presence of about 2 to about 15 psi water vapor pressure for about 10 minutes to about 4 hours, said reexchanging of step (c) is conducted under conditions sufficient to reduce said alkali metal content to less than about 1 percent determined as the corresponding alkali metal oxide, and said amorphous refractory inorganic oxide component is essentially silica-magnesia.

10. The catalyst of claim 9 including in intimate admixture therewith a catalytic amount of a hydrogenation active component selected from molybdenum, tungsten, nickel, cobalt and the Periodic Group VIII noble metals and compounds thereof, and the resultant combination is formed into a particleform aggregate and calcined at a temperature between about 600° and about 900°F.

11. The catalyst of claim 10 wherein said hydrogenation component is palladium.

12. The catalyst of claim 10 wherein said hydrogenation component comprises nickel and molybdenum.

13. The method of producing the catalyst of claim 1 comprising carrying out steps (a), (b), (c) and (d) of claim 1 in the recited sequence.

14. The method of claim 13 wherein said amorphous refractory inorganic oxide component is essentially silicamagnesia.

15. The method of claim 13 wherein said amorphous refractory inorganic oxide component is essentially alumina.

* * * * *